(12) United States Patent
Wong et al.

(10) Patent No.: US 8,651,159 B2
(45) Date of Patent: Feb. 18, 2014

(54) DIE BONDER PROVIDING A LARGE BONDING FORCE

(75) Inventors: Sun Kuen Wong, New Territories (HK); Hon Chiu Hui, Shatin (HK); Yin Fun Ng, Ap Lei Chau (HK)

(73) Assignee: ASM Assembly Automation Ltd, Hong Kong (HK)

( * ) Notice: Subject to any disclaimer, the term of this patent is extended or adjusted under 35 U.S.C. 154(b) by 758 days.

(21) Appl. No.: 12/483,529

(22) Filed: Jun. 12, 2009

(65) Prior Publication Data
US 2010/0314050 A1 Dec. 16, 2010

(51) Int. Cl.
*B29C 65/00* (2006.01)

(52) U.S. Cl.
USPC ............ 156/358; 156/368; 228/45; 228/49.1

(58) Field of Classification Search
USPC ............ 156/358, 538, 368; 228/45, 47.1, 48, 228/49.1, 49.2
See application file for complete search history.

(56) References Cited

U.S. PATENT DOCUMENTS

| | | | | |
|---|---|---|---|---|
| 4,913,763 A | * | 4/1990 | Yamazaki et al. | 156/358 |
| 5,246,513 A | * | 9/1993 | Yoshida et al. | 156/64 |
| 6,651,866 B2 | * | 11/2003 | Bendat et al. | 228/45 |
| 2004/0121513 A1 | * | 6/2004 | Taguchi et al. | 438/106 |
| 2004/0226980 A1 | * | 11/2004 | Kuboi | 228/49.1 |
| 2007/0084901 A1 | * | 4/2007 | Gaunekar et al. | 228/4.5 |
| 2009/0289098 A1 | * | 11/2009 | Terada et al. | 228/102 |

* cited by examiner

*Primary Examiner* — Christopher Schatz
*Assistant Examiner* — John Blades
(74) *Attorney, Agent, or Firm* — Ostrolenk Faber LLP

(57) ABSTRACT

A die bonder is provided comprising a bond head including a collet for picking up a die and bonding the die at a bonding site. The die bonder further comprises a first motor which is connected to the collet by a shaft for driving the collet in driving directions towards and away from the bonding site and a second motor which is connected to the bond head for driving the bond head in directions parallel to the driving directions of the first motor. A rotary motor is also operatively connected to the collet for rotating the collet about a rotational axis that is parallel to the driving directions of the first motor. The shaft is slidably connected to the rotary motor and is slidable relative to the rotary motor when it is driven by the first motor to move.

8 Claims, 2 Drawing Sheets ment accuracy of the bond head 101. Therefore, this bond head design cannot achieve very high placement accuracy nor meet stringent requirements regarding non-tilting of the die 108.

DIE BONDER PROVIDING A LARGE BONDING FORCE

FIELD OF THE INVENTION

The invention relates to a die bonder for electronic devices, and in particular, to a die bonder for generating a large bonding force for die bonding.

BACKGROUND AND PRIOR ART

During the production of semiconductor dice or chips, many semiconductor dice are formed together on a single wafer. The wafer is then cut to separate the individual dice. Each of these semiconductor dice should then be individually mounted onto a support surface for further processing by utilizing a die bonding process. Thereafter, electrical connections are created between the dice and external devices, and the dice are later encapsulated with a plastic compound to protect them from the environment.

In prior art die bonders utilized in the said die bonding process, each individual die is usually picked up by a bond arm from the wafer and then transported to a substrate to perform attachment of the die onto the substrate. A die bonder generally comprises a die bond head which has an air nozzle for creating a suction force to pick up a semiconductor die from a wafer platform holding the die. The die is then transported and bonded onto a substrate.

In order to place the die correctly and accurately onto the substrate, visual alignment is conducted with a vision system to capture images of the die on the wafer platform and the substrate. Positioning of the bond head and air nozzle will be performed according to the image captured of the die, which references an alignment pattern or fiducial mark on the die for this purpose. The bond head uses the captured image of the die to perform rotary compensation along a theta axis after picking up the die. Next, the bond head rotates and aligns the die to the orientation of the substrate before moving downwards to perform bonding. Downward movement of the bond head is facilitated by a z-axis motion motor while a bond force actuator applies a compressive force to the die directly. The compressive bonding force must be sufficiently large for pressing the die to the substrate.

FIG. 1 is a side view of a conventional die bonder 100 incorporating a preloaded compression spring 102 for die bonding. A bond head 101 of the die bonder 100 is mounted to a bond head mount 103, which is further slidably supported by a z-axis motion table 106. The bond head 101 applies a large bonding force on a die 108 during bonding aided by the preloaded compression spring 102. Additionally, there is a rotary motor 104 which is operative to rotate the bond head 101 for rotary or theta motion compensation.

When the z-axis motion table 106 moves downwards, it compresses the compression spring 102 and increases the bonding force acting on a die 108 after the die 108 contacts a substrate 110. A large z-axis drive-in motion in the vertical direction is created which induces an X-Y placement shift of the die bonder 100. Further, the bond head mount 103 and the z-axis motion table 106 include a linear guide which sustains a large upward force during bonding. This upward force passes through the bond head mount 103 and the z-axis motion table 106 and induces a placement shift on the bond head 101 and causes die tilting when performing bonding with a large bonding force. The operation is thus likely to bring about roll, pitch and yaw of the z-axis motion table 106, as well as to structurally deform the structure of the die bonder 100. All these deviations may serve to affect place- Another prior art die bonder 100' is shown in FIG. 2, which is a side view of a conventional die bonder incorporating a pneumatic cylinder 112 to provide a bonding force. A bond head 101' is mounted to a bond force motor in the form of the pneumatic cylinder 112 coupled to a z-axis motion table 106 via a spherical point of contact 114. A large bonding force is applied with the aid of the pneumatic cylinder 112 mounted to a support structure 118. The large bonding force loading is sustained by the support structure 118 directly and the main lines of force bypass the bond head mount 103 and the z-axis motion table 106. Thus, deformation of the bond head mount 103 and the z-axis motion table 106 is avoided. Die tilting due to the bond head mount 103 and deformation of the z-axis motion table 106 structure can also be avoided. Placement error due to the roll, pitch and yaw of the z-axis motion table 106 can also be reduced as there is no z-axis drive-in motion by the z-axis motion table 106. However in this design, the bond head 101' does not exhibit theta motion as it is fixedly coupled to the pneumatic bond force actuator, which is solely a linear driver. Hence, there is no rotary or theta compensation before the picked die 108 is bonded.

It would be desirable to implement a bond head capable of generating a large bonding force with reduced placement error, as well as provide rotary or theta compensation to correct any rotary offset of the die.

SUMMARY OF THE INVENTION

It is thus an object of the invention to seek to provide a bond head that produces a large bonding force while achieving more accurate die bonding as compared to the aforesaid prior art.

Accordingly, the invention provides a die bonder comprising: a bond head including a collet for picking up a die and bonding the die at a bonding site; a first motor connected to the collet by a shaft for driving the collet in driving directions towards and away from the bonding site; a second motor connected to the bond head for driving the bond head in directions parallel to the driving directions of the first motor; a rotary motor operatively connected to the collet for rotating the collet about a rotational axis that is parallel to the driving directions of the first motor; and wherein the shaft is slidably connected to the rotary motor so that the shaft is slidable relative to the rotary motor when it is driven by the first motor to move.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of one preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
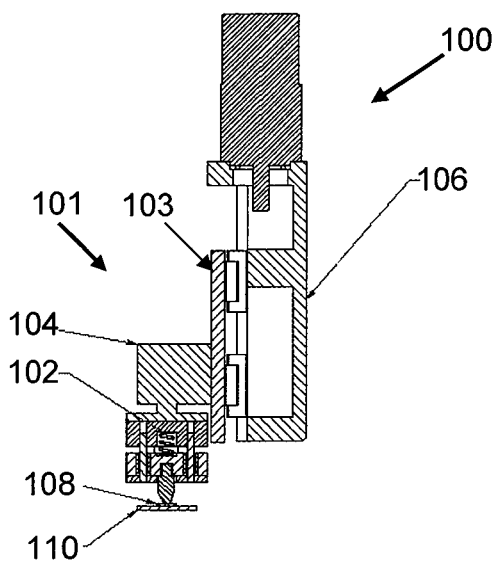
FIG. 1 is a side view of a conventional die bonder incorporating a preloaded compression spring.
Figure 2:
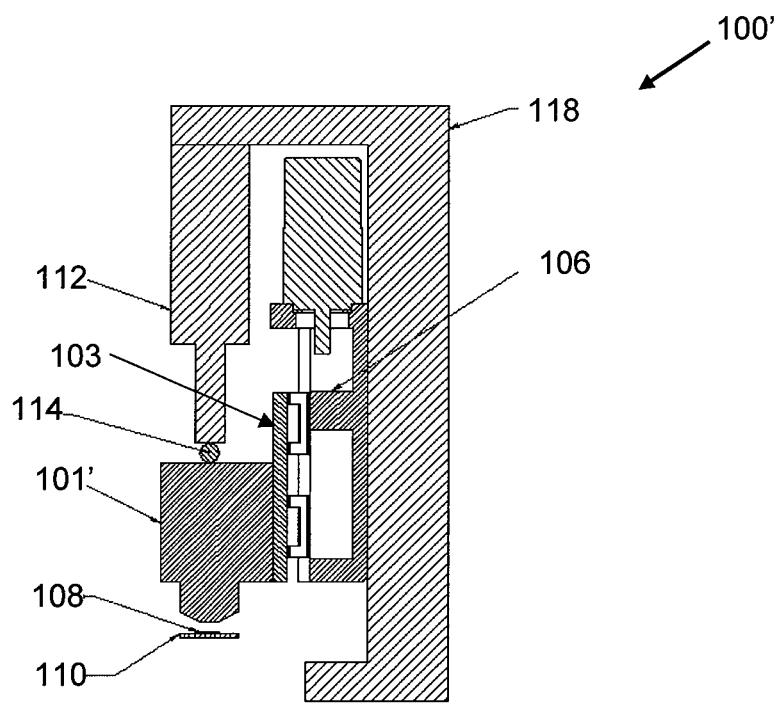
FIG. 2 is side view of a conventional die bonder incorporating a pneumatic cylinder.
Figure 3:
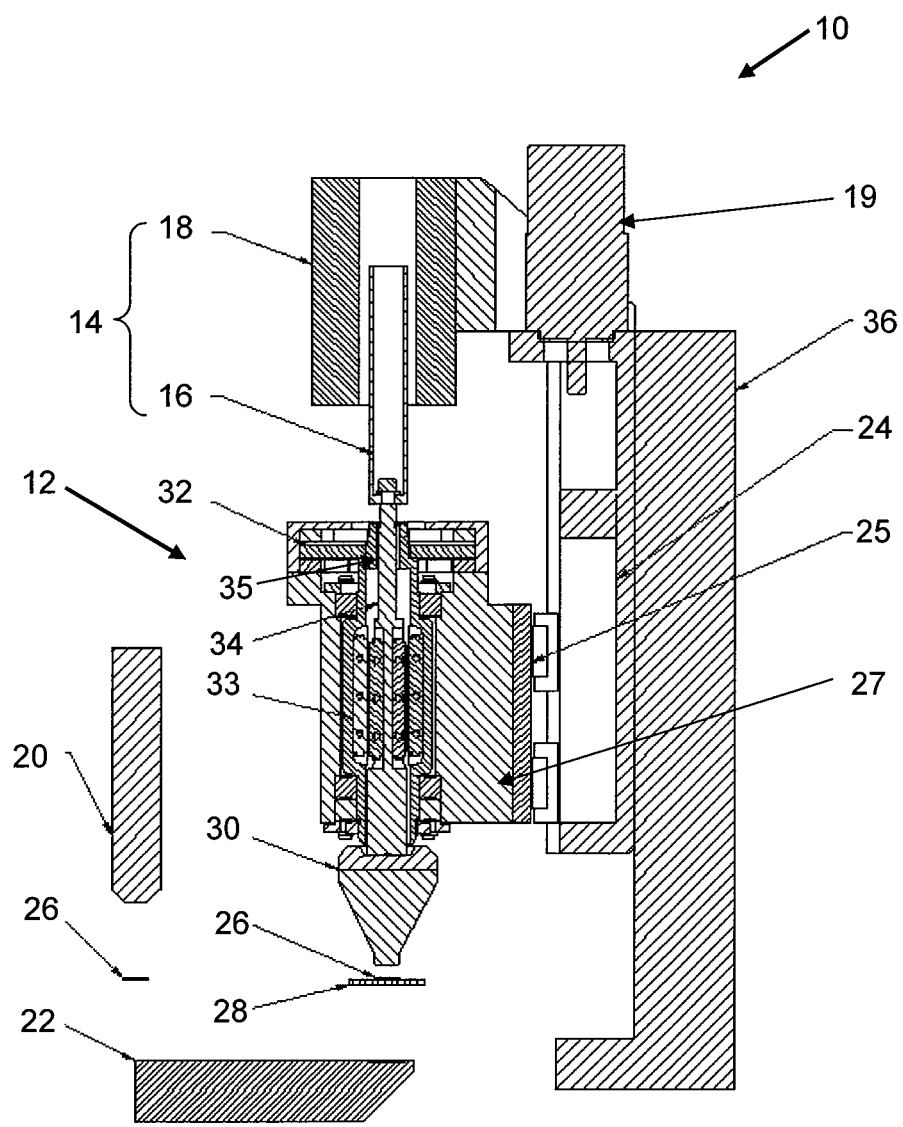
FIG. 3 is a side view of a die bonder incorporating a bond head that generates a large bonding force according to the preferred embodiment of the invention.

FIG. 3 is a side view of a die bonder 10 incorporating a bond head 12 that generates a large bonding force according to the preferred embodiment of the invention. The bond head 12 comprises a collet 30 and a first motor or bond force motor 14, which is preferably a linear motor. The bond force motor 14 generally comprises a bond force motor forcer 16 and a bond force motor stator 18. The bond force motor forcer 16 is connected to the collet 30 by a bond force decoupling shaft 34 for driving the collet 30 in the z-axis towards and away from the substrate 28. The collet 30 picks up a die 26 using vacuum or with a gripper and bonds the die 26 to a bonding site, which may be on a substrate 28. The bond force motor 14 of the bond head 12 generates a large bonding force to bond the die 26 to the substrate 28.

A second motor such as a z-motor 19 drives the bond head 12 to move along the z-axis. It is connected to the bond head 12 via a bond head mount 27. When the z-motor 19 drives a z-slider 25 which is coupled to the bond head mount 27 to move relative to a z-axis motion table 24, this driving motion also drives the bond force motor 14 to move together with the bond head 12.

The bond head 12 further comprises a rotary motor 32 which is connected to the collet 30 and rotates the collet 30 and the bond head 12 about a rotational axis parallel to the z-axis via a motor rotor 35 of the rotary motor 32. This allows the angular orientation of the picked die 26 relative to the substrate 28 to be adjusted and compensated before the die 26 is bonded to the substrate 28. The rotary motor 32 is decoupled from the bond force motor 14 by the bond force decoupling shaft 34 located in a force application path of the bond force motor 14. Both the bond force motor 14 and the z-motor 19 are mounted to a support structure 36.

The die bonder 10 further incorporates a downward-looking optical device 20 and an upward-looking optical device 22 for the purpose of aligning the die 26 with the substrate 28. In operation, an image of the die 26 taken from the downward-looking optical device 20 is captured so that the relative position of the die 26 with respect to the substrate 28 can be determined. The die 26 is transported by a shuttle conveyor (not shown) to and underneath the bond head 12 for die picking. X-Y compensation on a horizontal plane can be carried out by another shuttle conveyor (not shown) which is driven by an X-Y table.

Theta compensation may also be performed before the bond head 12 picks up the die 26 and aligns the collet 30 to the die 26 with the aid of the downward-looking optical device 20. The bond force decoupling shaft 34 is slidable relative to the rotary motor 32 by means of a bearing 33 on the motor rotor 35 for repositioning itself in the z-axis when it is driven by the bond force motor 14. The X-Y and theta compensations ensure that the die 26 is aligned accurately with the collet 30 when it is held by the collet 30. The shuttle moves out and the image of the die 26 is captured by the upward-looking optical device 22 such that the position of the die 26 relative to the substrate 28 can be determined. Then, the bond head 12 rotates and aligns the die 26 according to the orientation of the substrate 28 using a vision alignment system (not shown) which views the substrate before carrying out bonding.

The z-motor 19 drives the bond head 12 downwards via the z-slider 25 and stops once the die 26 contacts the substrate 28 and a feedback signal from a touch-down sensor is received. The bond force decoupling shaft 34 is triggered to move the bond head 12 slightly upwards. The bond force motor 14 which is located axially with the rotary centre of the bond head 12, applies a large compressive force to the die 26 directly through the bond force decoupling shaft 34 and the collet 30. Preferably, only the bond force motor 14 but not the z-motor 19 generates a z-axis drive-in motion on the die 26 to apply a downward bonding force to bond the die 26 at the bonding site on the substrate 28. The bond head 12 which is mounted on the bond head mount 27 is decoupled from this z-axis driving motion by the bond force decoupling shaft 34, which is slidably movable relative to the bond head 12. In this way, a bonding load resulting from a large drive-in motion of the die 26 to the substrate 28 after the die 26 contacts the substrate 28 is not transmitted to the bond head mount 27. Therefore, no load is passed directly from the bond head 12 to the bond head mount 27 and the z-axis motion table 24, which are thus decoupled from the z-axis driving motion. This avoids deforming the bond head mount 27 and the z-axis motion table 24 so that placement error due to structural deformation can be avoided. Placement error due to roll, pitch and yaw of the z-axis motion table 24 can also be avoided as there is no drive-in motion after the die 26 contacts the substrate 28.

It should be appreciated that the die bonder 10 in accordance with the preferred embodiment of the invention achieves die bonding with a large bonding force with precision while meeting the requirement for non-tilting of the die and rotary offset compensation. A compression load acts on the die 26 directly by a force from the bond force motor 14 through the bond force decoupling shaft 34 and the collet 30. Furthermore, the bond force motor 14 may provide an upward pull force to counter-balance the weight of the collet 30 and the bond force decoupling shaft 34 to achieve bonding with a lower bonding force overall and with less impact force.

Hence, by decoupling the bond force motor 14 from the z-motor 19 and the rotary motor 32 using the bond force decoupling shaft 34, a placement error of the bond head 12 due to the structural deformation of the bond head mount 27 and the z-axis motion table 24 can be reduced when a large bonding force is used during die bonding. Theta compensation can also be achieved to correct any die offset. Placement shift due to the z-axis drive-in motion, as well as die tilting, can also be avoided as no load passes through the bond head mount 27 and the z-axis motion table 24, which have been decoupled from the bond force motor 14.

The invention described herein is susceptible to variations, modifications and/or addition other than those specifically described and it is to be understood that the invention includes all such variations, modifications and/or additions which fall within the spirit and scope of the above description.

The invention claimed is:

1. A die bonder comprising:
 a bond head mount;
 a bond head connected to the bond head mount, the bond head including a collet for picking up a die and bonding the die at a bonding site;
 a first motor connected to the collet by a shaft for driving the collet in driving directions towards and away from the bonding site;

a second motor connected to the bond head mount for driving the bond head in directions parallel to the driving directions of the first motor;

a rotary motor operatively connected to the collet for rotating the collet about a rotational axis that is parallel to the driving directions of the first motor;

wherein the shaft is configured to decouple the bond head from the bond head mount after the die contacts the bonding site, wherein after decoupling the first motor is operative to drive the shaft to slide, with respect to the bond head mount, to thereby provide a bonding force to bond the die at the bonding site.

2. The die bonder as claimed in claim 1, wherein the first motor is a linear motor.

3. The die bonder as claimed in claim 1, wherein the bond head mount supports the bond head.

4. The die bonder as claimed in claim 1, further comprising a slider coupled to the bond head mount and drivable to slide in the driving directions by the second motor in directions parallel to the driving directions of the first motor for driving the bond head.

5. The die bonder as claimed in claim 1, wherein a bonding load generated by the first motor is not transmitted directly to the bond head mount.

6. The die bonder as claimed in claim 1, wherein the first motor is operative to drive the collet towards the bonding site to apply the bonding force to bond the die at the bonding site.

7. The die bonder as claimed in claim 1, wherein the shaft is slidably coupled to a rotor of the rotary motor by means of a bearing.

8. A die bonder comprising:
a bond head mount;
a bond head connected to the bond head mount, the bond head including a collet for picking up a die and bonding the die at a bonding site;
a first motor connected to the collet by a shaft for driving the collet in driving directions towards and away from the bonding site;
a second motor connected to the bond head mount for driving the bond head in directions parallel to the driving directions of the first motor;
a rotary motor operatively connected to the collet for rotating the collet about a rotational axis that is parallel to the driving directions of the first motor; and
wherein after the shaft has decoupled the bond head from the bond head mount, the first motor is operative to drive the shaft to slide, with respect to the bond head mount, to thereby provide a bonding force to bond the die at the bonding site.

* * * * *